(12) United States Patent
Mimotogi et al.

(10) Patent No.: US 8,055,366 B2
(45) Date of Patent: Nov. 8, 2011

(54) SIMULATION MODEL CREATING METHOD, MASK DATA CREATING METHOD AND SEMICONDUCTOR DEVICE MANUFACTURING METHOD

(75) Inventors: Shoji Mimotogi, Yokohama (JP); Masafumi Asano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 435 days.

(21) Appl. No.: 12/406,828

(22) Filed: Mar. 18, 2009

(65) Prior Publication Data

US 2009/0240362 A1 Sep. 24, 2009

(30) Foreign Application Priority Data

Mar. 19, 2008 (JP) .................................. 2008-070900

(51) Int. Cl.
*G06F 19/00* (2011.01)
*G06F 17/50* (2006.01)
*G06F 1/00* (2006.01)
*G06G 7/48* (2006.01)
*G06K 9/00* (2006.01)

(52) U.S. Cl. ................ 700/97; 700/121; 716/50; 703/2; 703/13; 382/144; 430/5

(58) Field of Classification Search ............... 700/97, 700/121; 703/2, 13; 430/5; 716/50; 382/144
See application file for complete search history.

(56) References Cited

U.S. PATENT DOCUMENTS

| | | | | | |
|---|---|---|---|---|---|
| 5,906,903 | A | * | 5/1999 | Mimotogi | 430/30 |
| 6,128,067 | A | * | 10/2000 | Hashimoto | 355/52 |
| 7,685,556 | B2 | * | 3/2010 | Fukuhara et al. | 716/54 |
| 7,788,626 | B2 | * | 8/2010 | Nojima et al. | 716/52 |
| 7,793,252 | B2 | * | 9/2010 | Kotani et al. | 716/50 |
| 7,840,390 | B2 | * | 11/2010 | Satake et al. | 703/2 |
| 2009/0148780 | A1 | * | 6/2009 | Yasuzato | 430/5 |
| 2009/0240364 | A1 | * | 9/2009 | Lucas et al. | 700/105 |

OTHER PUBLICATIONS

Liebmann, L. W. et al., "Optical Proximity Correction: a First Look at Manufacturability," Abstract of Proc. SPIE, vol. 2322, pp. 229-238, (1994).

* cited by examiner

*Primary Examiner* — Kidest Bahta
*Assistant Examiner* — Sivalingam Sivanesan
(74) *Attorney, Agent, or Firm* — Finnegan, Henderson, Farabow, Garrett & Dunner, L.L.P.

(57) ABSTRACT

A simulation model creating method computes, for measurement results of a line width of a resist pattern formed with varied an exposure amount and focus value, a permissible fluctuation range of the pattern line width from a distribution of the exposure amount and a distribution of the focus value; computes difference values between the measurement results and corresponding approximation values on a fitting function which has the exposure amount and focus value as parameters; compares the difference values with the permissible fluctuation range; deletes any measurement values for which the difference value is larger than the permissible fluctuation range, and recomputes the fitting function accordingly; and deletes measurement values outside a permissible fluctuation range of a pattern line width of the mask, and creates a simulation model.

20 Claims, 5 Drawing Sheets

SIMULATION MODEL CREATING METHOD, MASK DATA CREATING METHOD AND SEMICONDUCTOR DEVICE MANUFACTURING METHOD

CROSS REFERENCE TO RELATED APPLICATION

This application is based upon and claims benefit of priority from the Japanese Patent Application No. 2008-70900, filed on Mar. 19, 2008, the entire contents of which are incorporated herein by reference.

BACKGROUND OF THE INVENTION

1. Field of the Invention

The present invention relates to a simulation model creating method, a mask data creating method and a semiconductor device manufacturing method.

2. Related Art

In recent years, with the micronization of LSI, the OPE (Optical Proximity Effect) which causes dimension fluctuations and shape changes between the pattern of the mask used in the exposure and the pattern obtained on the wafer has become a problem. For this reason, OPC (Optical Proximity Correction) in which the mask pattern is corrected by taking into account the OPE in advance has been adopted (see, for example, L. W. Liebmann, B. Grenon, M. Lavin, S. Schomody, and T. Zell, "Optical proximity correction, a first at manufacturability," Proceedings of SPIE Vol. 2322 (1994), pp. 229-238).

One OPC technique which allows a high level of correction accuracy to be obtained is model-based OPC by which suitable amounts of adjustment for mask dimensions are computed based on a lithography simulation is known. In model-based OPC, various parameters of the lithography simulation are found from OPE characteristics, such as line dimension pitch-dependency, obtained in advance by experiment (i.e. the OPE characteristics are modeled).

One experiment used to acquire the OPE characteristics involves forming a test pattern on a wafer and measuring dimensions of the pattern using a CD-SEM (Critical Dimension-Scanning Electron Microscope).

The measurement results of the pattern dimensions can include abnormal values caused by autofocus errors and the like. However, conventionally, the model is created with the abnormal values still included, causing the problem of a drop in modeling accuracy.

SUMMARY OF THE INVENTION

According to one aspect of the present invention, there is provided a simulation model creating method comprising:

computing, for measurement results of a pattern line width of a resist pattern formed by transferring a pattern of a mask onto a wafer with an exposure amount and a focus value varied, a first permissible fluctuation range of the pattern line width from a distribution of the exposure amount and a distribution of the focus value;

computing a function which is a polynomial including the exposure amount and focus value as parameters and fits the measurement results of the pattern line width, and computing difference values between measurement values of the measurement results and corresponding approximation values from the function as first differences;

comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;

computing a second permissible fluctuation range for the pattern line width of the resist pattern from an average value and a distribution of a pattern line width of the mask;

executing lithography simulation for the mask using a simulation model created based on the measurement results, and computing predicted line widths of a pattern to be formed on a wafer;

computing, as second differences, difference values between the measurement values of the measurement results and the predicted line widths; and comparing the second difference with the second permissible fluctuation range for each measurement value, and, if the second difference exceeds the permissible fluctuation range, deleting the measurement value and creating a simulation model based on the post-deletion measurement results.

According to one aspect of the present invention, there is provided a mask data creating method comprising:

computing, for measurement results of a pattern line width of a resist pattern formed by transferring a pattern of a mask onto a wafer with an exposure amount and a focus value varied, a first permissible fluctuation range of the pattern line width from a distribution of the exposure amount and a distribution of the focus value;

computing a function which is a polynomial including the exposure amount and focus value as parameters and fits the measurement results of the pattern line width, and computing difference values between measurement values of the measurement results and corresponding approximation values from the function as first differences;

comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;

computing a second permissible fluctuation range for the pattern line width of the resist pattern from an average value and a distribution of a pattern line width of the mask;

executing lithography simulation for the mask using a first simulation model created based on the measurement results, and computing predicted line widths of a pattern to be formed on a wafer;

computing, as second differences, difference values between the measurement values of the measurement results and the predicted line widths;

comparing the second difference with the second permissible fluctuation range for each measurement value, and, if the second difference exceeds the permissible fluctuation range, deleting the measurement value and creating a second simulation model based on the post-deletion measurement results; and creating mask data from design data using the second simulation model.

According to one aspect of the present invention, there is provided a semiconductor device manufacturing method comprising:

computing, for measurement results of a pattern line width of a first resist pattern formed by transferring a pattern of a mask onto a first wafer with an exposure amount and a focus value varied, a first permissible fluctuation range of the pattern line width from a distribution of the exposure amount and a distribution of the focus value;

computing a function which is a polynomial including the exposure amount and focus value as parameters and fits the measurement results of the pattern line width, and computing difference values between measurement values of the measurement results and corresponding approximation values from the function as first differences;

comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;

computing a second permissible fluctuation range for the pattern line width of the first resist pattern from an average value and a distribution of a pattern line width of the mask;

executing lithography simulation for the mask using a first simulation model created based on the measurement results, and computing predicted line widths of a pattern to be formed on a wafer;

computing, as second differences, difference values between the measurement values of the measurement results and the predicted line widths;

comparing the second difference with the second permissible fluctuation range for each measurement value, and, if the second difference exceeds the second permissible fluctuation range, deleting the measurement value and creating a second simulation model based on the post-deletion measurement results;

creating mask data from design data using the second simulation model;

transferring a mask pattern based on the mask data to a photoresist on a second wafer;

forming a second resist pattern on the second wafer by development processing; and with the second resist pattern as a mask, processing a film to be processed on the second wafer.

DETAILED DESCRIPTION OF THE INVENTION

The following describes an embodiment of the invention with reference to the drawings.

Figure 1:
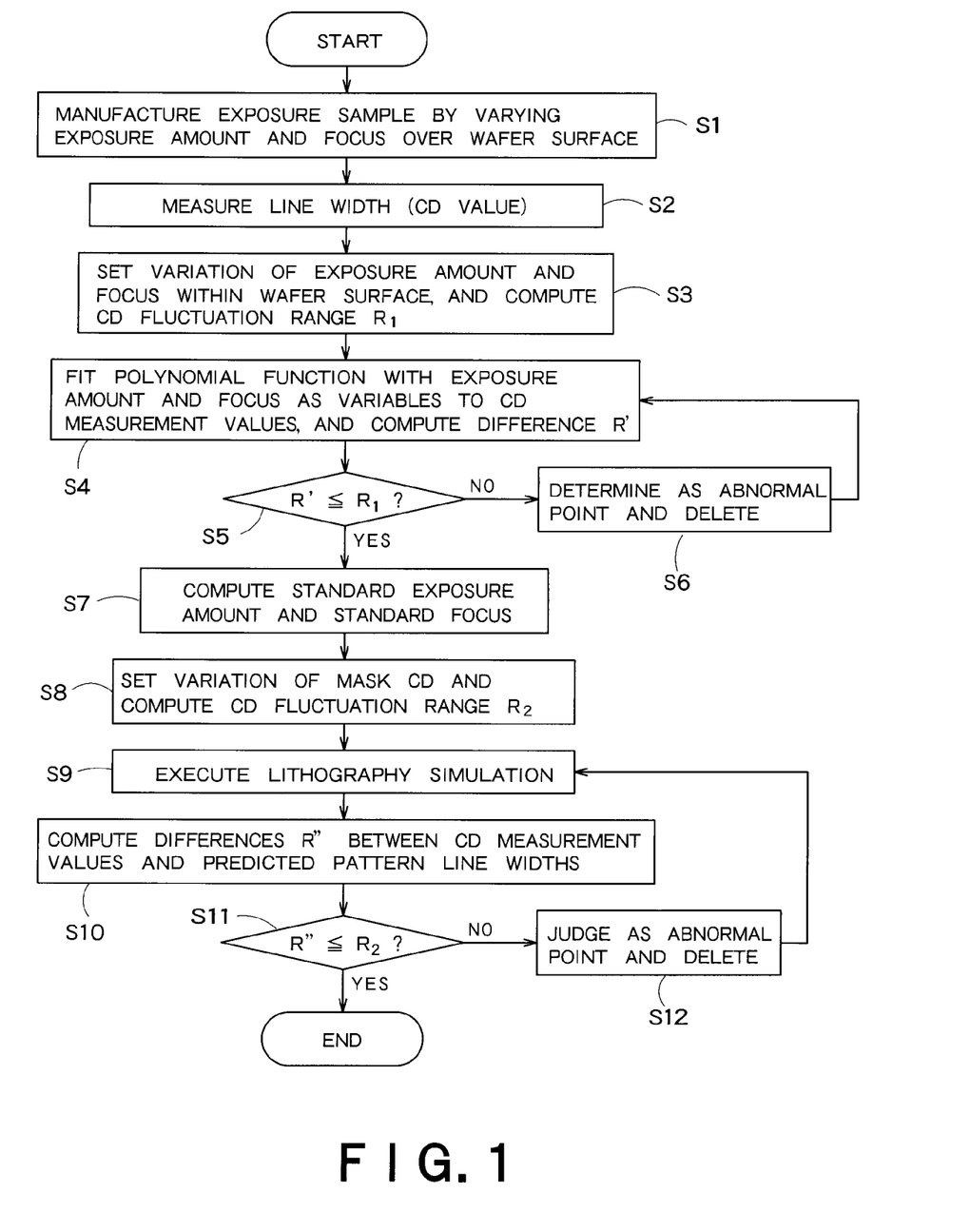
FIG. 1 is a flowchart describing a simulation model creating method according to an embodiment of the invention.

FIG. 1 shows a flowchart of a simulation model creating method according to an embodiment of the invention.

(Step S1) Resist patterns (exposure samples) are manufactured by transferring mask patterns to resist films on wafers while varying an exposure amount and focus settings of an exposure apparatus. Using mask patterns with various difference line widths and the like, a plurality of different resist patterns are manufactured.

(Step S2) The line width CDs (Critical Dimensions) of the resist patterns formed on the wafers are measured using an SEM.

Figure 2:
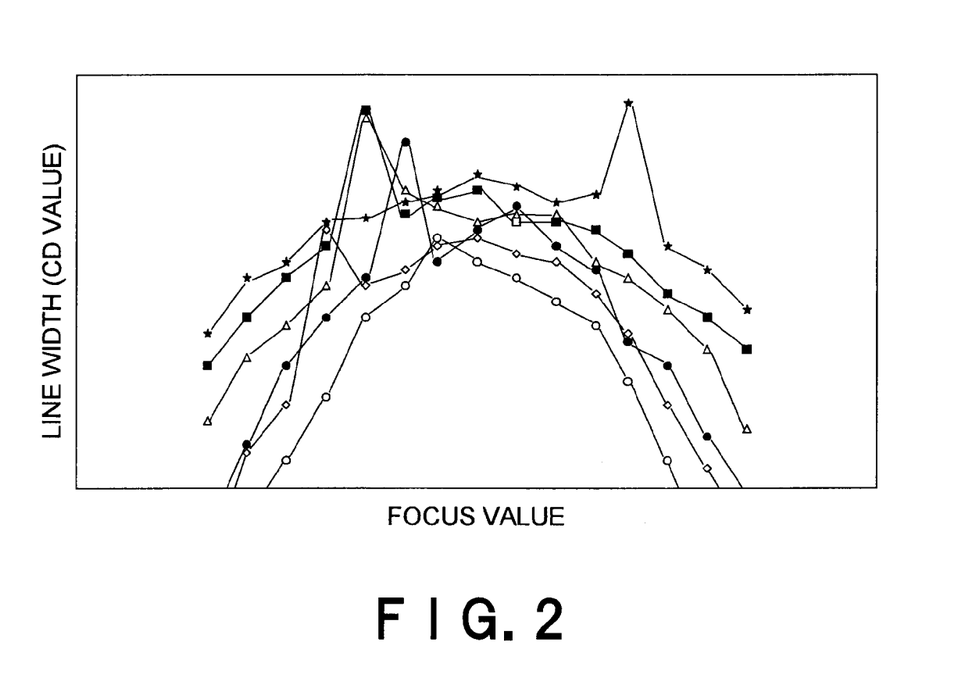
FIG. 2 is a graph showing a relationship between measurement results of the resist pattern line width and focus value.

An example of the SEM measurement results from one resist pattern formed while varying the exposure amount and focus is shown in FIG. 2. The vertical axis corresponds to pattern line width (measurement results), and the horizontal axis corresponds to focus values. The focus value reduces as the focal plane is lowered into the resist. The different marker types for the points in the graph of FIG. 2 correspond to different exposure amounts.

Generally speaking, line width W can be expressed as a function of exposure amount E, focus D and mask line width M using a formula of the type shown below.

$$W = f(E,D,M)$$

(Step S3) A variance "$\sigma_W^2$" of the distribution of the pattern line width W measured at the wafer surface is computed. When a variance of the distribution of the exposure amount is denoted "$\sigma_E^2$", a variance of the distribution of the focus is denoted "$\sigma_D^2$" and the mask line width M is fixed, the variance $\sigma_W^2$ can be expressed using the following formula.

$$\sigma_W^2 = \left(\frac{\partial f}{\partial E}\right)^2 \sigma_E^2 + \left(\frac{\partial f}{\partial D}\right)^2 \sigma_D^2$$

A permissible fluctuation range $R_1$ of the width with respect to exposure amount/focus is then computed using the variance $\sigma_W^2$. For instance, the permissible fluctuation range $R_1$ may be given by $R_1 = 3 \times \sigma_W$. Note that although the permissible fluctuation range $R_1$ is set to be three times $\sigma_W$ here, the permissible fluctuation range is not limited by this definition and can be increased or reduced according to a desired level of accuracy.

(Step S4) A polynomial function of the exposure amount E and the focus D is fitted to the measured pattern line widths W. The polynomial function (fitting function) used in the fitting can, for instance, be expressed using formulas W1 and W2 below.

$$W1 = (a \cdot D^2 + b \cdot D + c) \cdot E + (a' \cdot D^2 + b' \cdot D + c')$$

$$W2 = (a \cdot D^2 + b \cdot D + c) \cdot \log E + (a' \cdot D^2 + b' \cdot D + c')$$

Here, a', a, b, b', c, and c' are coefficients determined in the fitting.

Figure 3A:
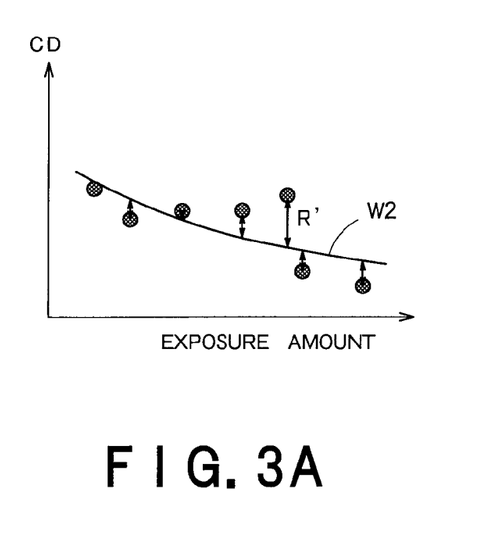
FIGS. 3A and 3B are graphs resulting from fitting a fitting function to measurement results of the resist pattern line width for varying exposure amounts.

For instance, when fitting for the exposure amount is performed using the fitting function W2 with the focus value held constant, the result is as shown in FIG. 3A. The differences R' between the measured values and the approximation values on the curve of the fitting function W2 are then computed. In a similar way, fitting is performed with respect to the focus while holding the exposure amount constant, and the differences R' is computed.

(Step S5) The existence of a point (measurement results) for which the difference R' is larger than the permissible fluctuation range $R_1$ is detected. When such a point exists, the processing proceeds to step S6. When no such point exists, the processing proceeds to step S7.

Figure 3B:
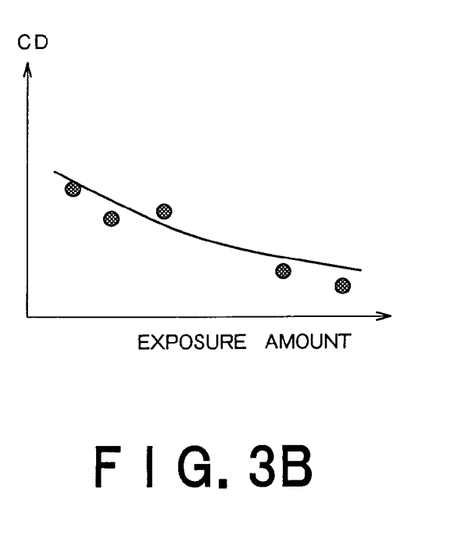

(Step S6) The point for which the difference R' is larger than the permissible fluctuation range $R_1$ is determined to be an abnormal point, and deleted. For instance, when the abnormal points are deleted from FIG. 3A, the result is shown in FIG. 3B. After the deletion, the processing returns to step S4.

Figure 4:
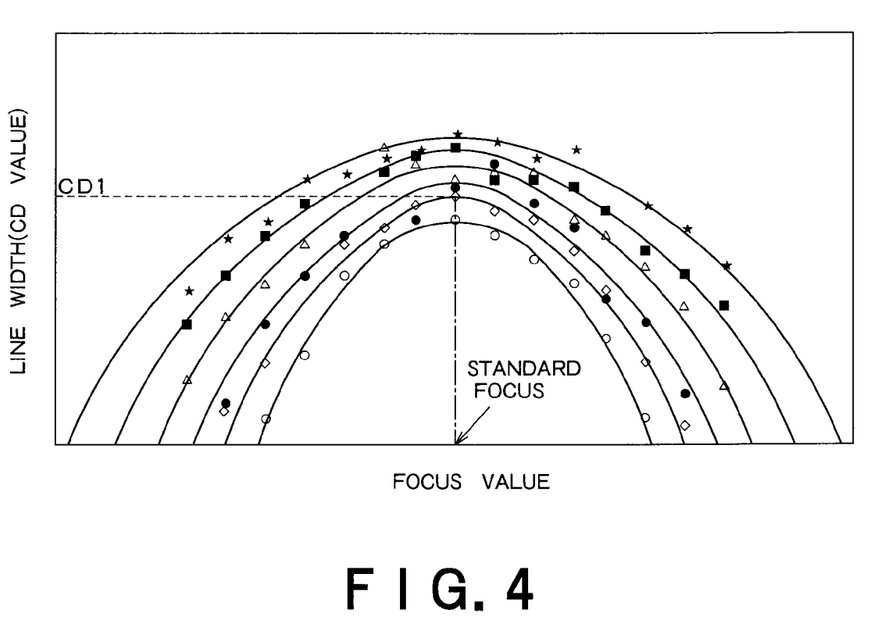
FIG. 4 is a graph resulting from fitting functions to measurement results of resist pattern line width after removing the abnormal points.

(Step S7) A standard exposure amount and standard focus are obtained from a desired pattern line width using the measurement results from after deletion of the abnormal points and the fitting function. For instance, when fitting is performed after deleting the abnormal points in FIG. 2, the result is as shown in the graph of FIG. 4. As shown in FIG. 4, of the exposure amounts, the exposure amount with the fitting function whose maximum value is the desired pattern line width CD1 becomes a "standard exposure amount" and the focus value at which the maximum value occurs becomes a "standard focus value". The maximum value of the fitting function is used because the effect of exposure amount fluctuation on the pattern line width is small at this point.

(Step S8) A permissible fluctuation range $R_2$ for the pattern line width W, which is dependent on the mask line width M, is computed. When the average value of the fluctuation of the mask line width is denoted $M_{mean}$, and the variance of the distribution is denoted $\sigma_M^2$, $R_2$ can be expressed using the following formula. The effects of the distribution of exposure amount and the distribution of the focus are removed and only the fluctuation in mask line width needs to be considered.

$$R_2 = \left|\frac{\partial f}{\partial M}\right|(|M_{mean}| + 3\sigma_M)$$

(Step S9) Next, the simulation model is created based on the measured results (modeling), and lithography simulation is performed which takes into account the illumination conditions of exposure apparatus, the mask pattern, the conditions of the projecting optical system and the like.

(Step S10) A difference R" between a predicted pattern line widths obtained using the lithographic simulation and the line widths W measured in step S2 is computed. Note that the measurement values deleted in step S6 are not considered.

(Step S11) The existence of points for which the difference R" is larger than the permissible fluctuation range $R_2$ is detected. When such a point exists, the processing proceeds to step S12. When no such points exist, the processing ends.

(Step S12) The point for which the difference R" is larger than the permissible fluctuation range $R_2$ is determined to be an abnormal point and deleted. The processing then returns to step S9. When the processing returns to step S9, a simulation model is created based on the measured points after removal of the abnormal point, and the lithography simulation is performed again. Note that the steps S9 to S12 can be repeated until all the abnormal points are removed.

Deleting the abnormal points of steps S4 to S6 removes the effects of exposure amount distribution within the wafer surface and focus distribution. Further, deleting the abnormal points in steps S9 to S12 removes the effects of mask line width distribution.

Thus, in the present embodiment, since the measurement values which exceed the line width fluctuation (permissible fluctuation range) expected in the mask-including process fluctuation are deleted as abnormal points to create the model, it is possible to improve the accuracy of the modeling (model-based OPC). Further, since the process from the acquisition of line width measurement data to the deletion of abnormal points can be performed automatically by executing programs and the like and thus without human input, the data processing efficiency is high.

With regard to deletion of the abnormal points, the Mahalanobis distance d of each measured point may be computed using the following approximation formula W3 for the line width w with an exposure amount E and a focus value D as parameters, and measured values for which the Mahalanobis distance d is at or over a predetermined threshold value may be deleted.

$$W3 = a_0 + a_1\left(1 - \frac{E_0}{E}\right) + a_2\left(1 - \frac{E_0}{E}\right)^2 + D\left[a_3 + a_4\left(1 - \frac{E_0}{E}\right) + a_5\left(1 - \frac{E_0}{E}\right)^2\right] + D^2\left[a_6 + a_7\left(1 - \frac{E_0}{E}\right) + a_8\left(1 - \frac{E_0}{E}\right)^2\right]$$

where a0 to a8 are coefficients determined in the fitting and E0 is a standard focus amount The approximation formula W3 expresses physically the relationship between line width and exposure amount/focus, and is described in, for example, C. A. Mack, J. D. Byers, "Improved model for focus-exposure data analysis", proc. SPIE vol 5038 pp. 396 (2003). The Mahalanobis distance d can be expressed using the following formula.

$$d = \frac{|w - wf|}{\sigma}$$

Figure 5:
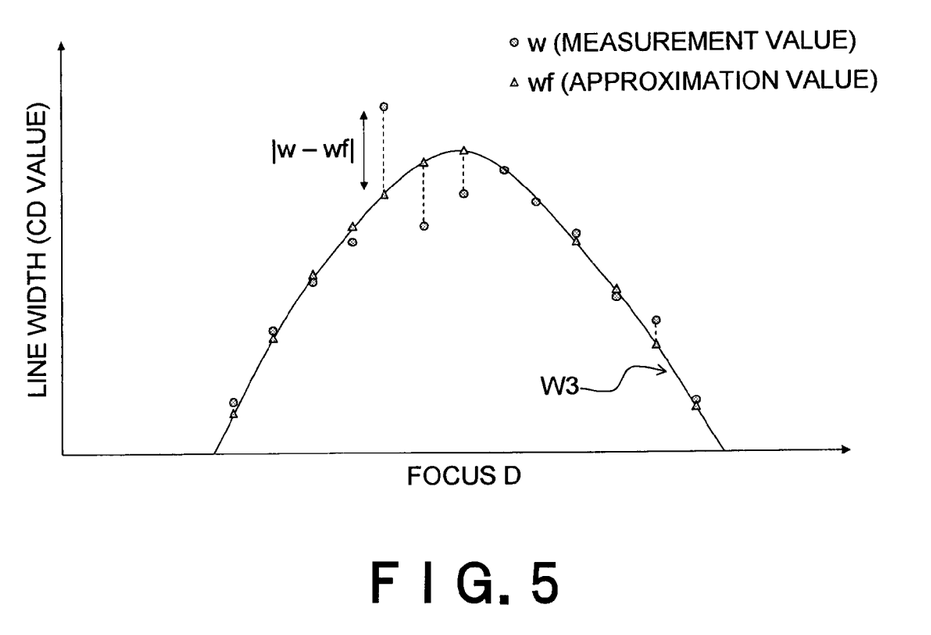
FIG. 5 is a graph showing approximation values at each set exposure amount/focus.

Here, wf is an approximation value (computed using the approximation formula W3) based on exposure amount/focus settings, and σ is the standard deviation of w−wf for all the measured points. An example of an approximation value wf for focus is shown in FIG. 5.

Figure 6:
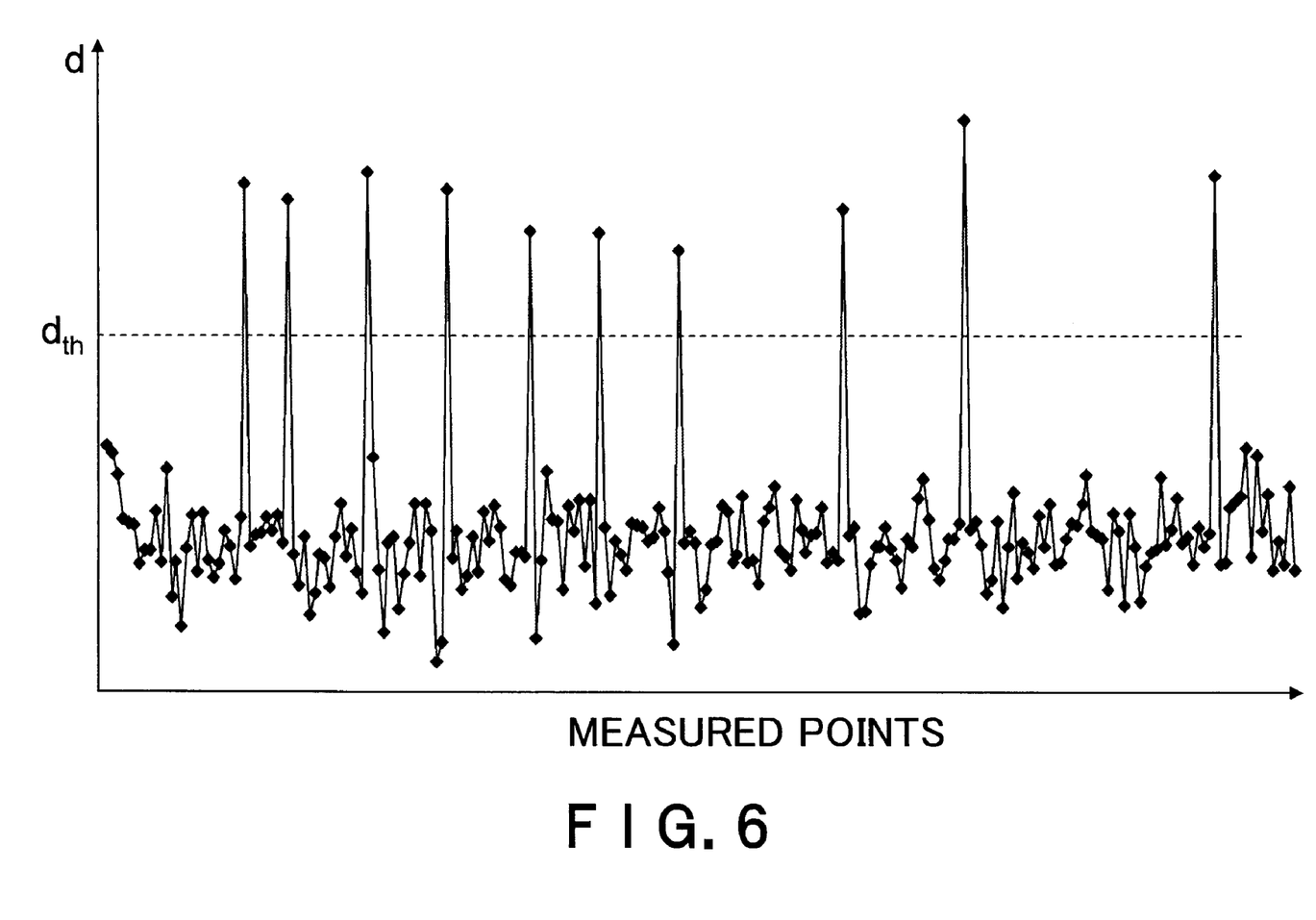
FIG. 6 is a graph showing an example of Mahalanobis distance at each measurement point.

The Mahalanobis distance d for each measured point is shown in FIG. 6. Some of the peak values are considered to be abnormal values caused by auto focus errors or the like. For instance, a threshold value dth of the Mahalanobis distance d may be set to 3×σ, and the peak values which exceed the threshold value dth may be determined to be abnormal values and be deleted.

Since it is possible to delete abnormal values included in the resist pattern measurement results in the same way as in the above-described embodiment, subsequent modeling accuracy can be improved.

Further, Mahalanobis distances d' between the measurement results after deletion of the abnormal values using the Mahalanobis distance d and the predicted line widths obtained using the lithography simulation may be obtained, and measured values for which the Mahalanobis distance is equal to or exceeds a predetermined threshold value may be determined to be abnormal values and deleted.

The above-described simulation model creating method can be applied in a semiconductor device manufacturing method. After the processing using the above-described simulation model creating method has been completed, a model for simulating exposure properties and focus properties for differing resist pattern dimensions is created.

Mask data is then generated from design data using the created simulation model. Moreover, a photomask is manufactured based on the generated mask data. The pattern formed in the manufactured photomask in this way is transferred to a photoresist on the semiconductor wafer, and then the photoresist is developed to form a resist pattern. Etching is then performed with the resist pattern as a mask to form the pattern on the semiconductor wafer.

Figure 7:
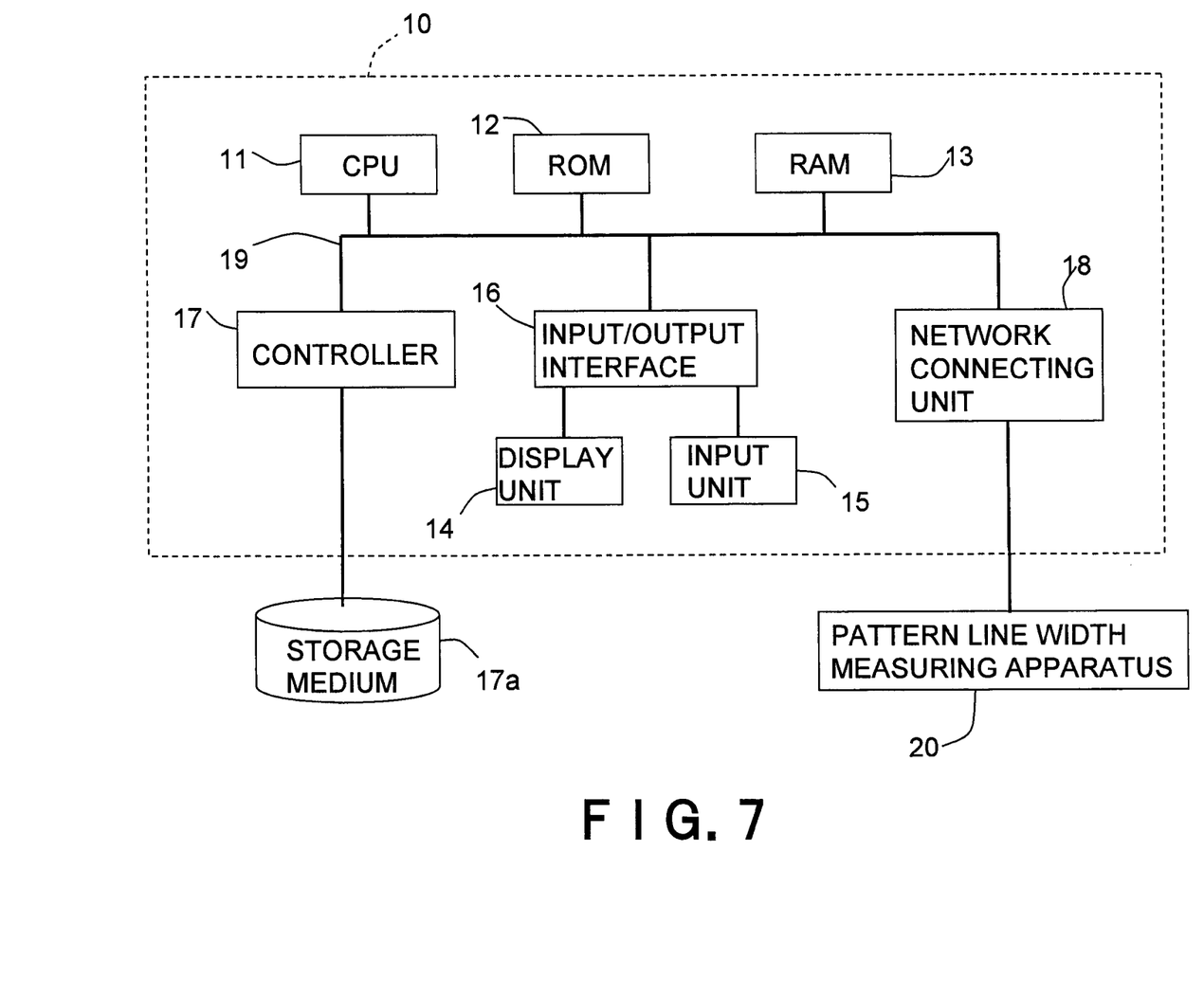
FIG. 7 is a schematic view of a simulation model creating apparatus according the embodiment of the invention.

The above-described simulation model creating method is executed by a simulation model creating apparatus 10 and a pattern line width measuring apparatus 20 of the type shown in FIG. 7. The simulation model creating apparatus 10 includes a CPU 11, a ROM 12, a RAM 13, a display unit 14, an input unit 15, and input/output interface 16, a controller 17, and a network connecting unit 18. The various units are connected to one another via a bus line 19.

The simulation model creating program (not shown), which is a computer program for performing the simulation model creation, is stored in an external storage medium 17a, such as magnetic disk or optical disk, of the simulation model creating apparatus 10, in an computer (not shown), such as a server or workstation, located externally to the simulation model creating apparatus 10, or in an internal memory, such as the ROM 12, of the simulation model creating apparatus 10.

The computer program, if stored in the storage medium 17a, is loaded into the RAM 13 via the controller 17 and the bus line 19. If stored in an external server or the like, the computer program is loaded into the RAM 13 via the network connecting unit 18 and the bus line 19. If stored in the ROM 12, the computer program is loaded into the RAM 13 via the bus line 19. The CPU 11 executes the simulation model creating program loaded in the RAM 13.

The pattern line width measuring apparatus 20 measures the line width of the plurality differing resist patterns formed on the wafer (Step S2). The pattern line width measuring apparatus 20 is connected via a network to the simulation model creating apparatus 10, and outputs the measurement results to the simulation model creating apparatus 10 via the network connecting unit 18. Alternatively, the pattern line width measuring apparatus 20 may store the measurement results in the storage medium 17a without connecting to the network, and the simulation model creating apparatus 10 may acquire the measurement results using the controller 17.

The processing of steps S3 to S12 is executed by the CPU 11 executing the simulation model creating program and processing the measurement results.

What is claimed is:

1. A simulation model creating method comprising:
computing, for measurement results of a pattern line width of a resist pattern formed by transferring a pattern of a mask onto a wafer with an exposure amount and a focus value varied, a first permissible fluctuation range of the pattern line width from a distribution of the exposure amount and a distribution of the focus value;
computing a function which is a polynomial including the exposure amount and focus value as parameters and fits the measurement results of the pattern line width, and computing difference values between measurement values of the measurement results and corresponding approximation values from the function as first differences;
comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;
computing a second permissible fluctuation range for the pattern line width of the resist pattern from an average value and a distribution of a pattern line width of the mask;
executing lithography simulation for the mask using a simulation model created based on the measurement results, and computing predicted line widths of a pattern to be formed on a wafer;
computing, as second differences, difference values between the measurement values of the measurement results and the predicted line widths; and
comparing the second difference with the second permissible fluctuation range for each measurement value, and, if the second difference exceeds the permissible fluctuation range, deleting the measurement value and creating a simulation model based on the post-deletion measurement results.

2. The simulation model creating method according to claim 1, wherein the resist pattern is formed by transferring patterns of a plurality of masks, each having a different line width.

3. The simulation model creating method according to claim 1, wherein
a variance of a distribution of the pattern line width is computed using the variance of the distribution of the exposure amount and the variance of the distribution of the focus value, and the first permissible fluctuation range is computed based on the variance of the distribution of the pattern line width.

4. The simulation model creating method according to claim 1, wherein
the first permissible fluctuation range is three times a standard deviation of the measurement results.

5. The simulation model creating method according to claim 1, wherein
the function is a polynomial function with the exposure amount and focus value, and fitting is performed for a case when the exposure amount is constant and for a case when the focus value is constant to calculate the first differences.

6. The simulation model creating method according to claim 5, wherein
when the exposure amount is denoted "E", the focus value is denoted "D", and a, b, c, a', b', c' denote real number coefficients determined in fitting, the polynomial function is expressed as $(a \cdot D^2 + b \cdot D + c) \cdot E + (a' \cdot D^2 + b' \cdot D + c')$.

7. The simulation model creating method according to claim 5, wherein
when the exposure amount is denoted "E", the focus value is denoted "D", and a, b, c, a', b', c' denote real number coefficients determined in fitting, the polynomial function is expressed as $(a \cdot D^2 + b \cdot D + c) \cdot \log E + (a' \cdot D^2 + b' \cdot D + c')$.

8. The simulation model creating method according to claim 1, wherein
Mahalanobis distances are computed as the first differences.

9. The simulation model creating method according to claim 8, wherein when the exposure amount is denoted "E", a standard exposure amount is denoted "$E_0$", the focus value is denoted "D", and "$a_0$" to "$a_8$" denote real number coefficients determined in fitting, the function is expressed as $a_0+a_1(1-E_0/E)+a_2(1-E_0/E)^2+D\{a_3+a_4(1-E_0/E)+a_5(1-E_0/E)^2\}+D^2\{a_6+a_7(1-E_0/E)+a_8(1-E_0/E)^2\}$, and, when the measurement value is denoted "w", an approximation value of the function is denoted "wf", and a standard deviation of w−wf over all the measurement values is denoted "$\sigma$", the Mahalanobis distance for the measurement value is expressed as |w−wf|/$\sigma$.

10. The simulation model creating method according to claim 1, wherein
Mahalanobis distances are computed as the second differences.

11. The simulation model creating method according to claim 1, wherein of functions fitted to the measurement results for each exposure amount after the first difference has become smaller than the first permissible fluctuation range, a function having a maximum value that is a predetermined pattern line width is detected, the exposure amount corresponding to the function is defined as the standard exposure amount, and a focus value at which the function reaches the maximum value is defined as the standard focus value.

12. The simulation model creating method according to claim 1, wherein
when the pattern line width of the mask is denoted "M", a mean pattern line width of the mask is denoted "$M_{mean}$", a variance of the distribution is denoted "$\sigma_M^2$", and a function expressing the pattern line width of the resist pattern in terms of the exposure amount, the focus value and the pattern line width M of the mask is denoted "f", the second permissible fluctuation range is computed using a formula expressed as $|\partial f/\partial M|(|M_{mean}|+3\sigma_M)$.

13. A mask data creating method comprising:
computing, for measurement results of a pattern line width of a resist pattern formed by transferring a pattern of a mask onto a wafer with an exposure amount and a focus value varied, a first permissible fluctuation range of the pattern line width from a distribution of the exposure amount and a distribution of the focus value;
computing a function which is a polynomial including the exposure amount and focus value as parameters and fits the measurement results of the pattern line width, and computing difference values between measurement values of the measurement results and corresponding approximation values from the function as first differences;
comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;
computing a second permissible fluctuation range for the pattern line width of the resist pattern from an average value and a distribution of a pattern line width of the mask;
executing lithography simulation for the mask using a first simulation model created based on the measurement results, and computing predicted line widths of a pattern to be formed on a wafer;
computing, as second differences, difference values between the measurement values of the measurement results and the predicted line widths;
comparing the second difference with the second permissible fluctuation range for each measurement value, and, if the second difference exceeds the permissible fluctuation range, deleting the measurement value and creating a second simulation model based on the post-deletion measurement results; and
creating mask data from design data using the second simulation model.

14. The mask data creating method according to claim 13, wherein
the resist pattern is formed by transferring patterns of a plurality of masks, each having a different line width.

15. The mask data creating method according to claim 13, wherein
a variance of a distribution of the pattern line width is computed using a variance of the distribution of the exposure amount and a variance of the distribution of the focus value, and the first permissible fluctuation range is computed based on the variance of the distribution of the pattern line width.

16. The mask data creating method according to claim 13, wherein
the function is a polynomial function with the exposure amount and focus value, and fitting is performed for a case when the exposure amount is constant and for a case when the focus value is constant to calculate the first differences.

17. A semiconductor device manufacturing method comprising:
computing, for measurement results of a pattern line width of a first resist pattern formed by transferring a pattern of a mask onto a first wafer with an exposure amount and a focus value varied, a first permissible fluctuation range of the pattern line width from a distribution of the exposure amount and a distribution of the focus value;
computing a function which is a polynomial including the exposure amount and focus value as parameters and fits the measurement results of the pattern line width, and computing difference values between measurement values of the measurement results and corresponding approximation values from the function as first differences;
comparing the first difference with the first permissible fluctuation range for each measurement value, and, if the first difference exceeds the first permissible fluctuation range, deleting the measurement value and then, until the first difference is less than the first permissible fluctuation range, repeating computation of a function which fits post-deletion measurement results, comparison of the first difference and the first permissible fluctuation range for a new measurement value, and deletion of the new measurement value if the first difference exceeds the first permissible fluctuation range;
computing a second permissible fluctuation range for the pattern line width of the first resist pattern from an average value and a distribution of a pattern line width of the mask;
executing lithography simulation for the mask using a first simulation model created based on the measurement results, and computing predicted line widths of a pattern to be formed on a wafer;
computing, as second differences, difference values between the measurement values of the measurement results and the predicted line widths;

comparing the second difference with the second permissible fluctuation range for each measurement value, and, if the second difference exceeds the second permissible fluctuation range, deleting the measurement value and creating a second simulation model based on the post-deletion measurement results;

creating mask data from design data using the second simulation model;

transferring a mask pattern based on the mask data to a photoresist on a second wafer;

forming a second resist pattern on the second wafer by development processing; and with the second resist pattern as a mask, processing a film to be processed on the second wafer.

18. The semiconductor device manufacturing method according to claim 17, wherein the first resist pattern is formed by transferring patterns of a plurality of masks, each having a different line width.

19. The semiconductor device manufacturing method according to claim 17, wherein a variance of a distribution of the pattern line width is computed using a variance of the distribution of the exposure amount and a variance of the distribution of the focus value, and the first permissible fluctuation range is computed based on the variance of the distribution of the pattern line width.

20. The semiconductor device manufacturing method according to claim 17, wherein the function is a polynomial function with the exposure amount and focus value, and fitting is performed for a case when the exposure amount is constant and for a case when the focus value is constant to calculate the first differences.

* * * * *